(12) United States Patent
Miao et al.

(10) Patent No.: US 9,150,956 B2
(45) Date of Patent: Oct. 6, 2015

(54) MONOLITHIC ALUMINUM ALLOY TARGET AND METHOD OF MANUFACTURING

(71) Applicant: Tosoh SMD, Inc., Grove City, OH (US)

(72) Inventors: Weifang Miao, Columbus, OH (US); David B. Smathers, Columbus, OH (US); Robert S. Bailey, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 199 days.

(21) Appl. No.: 13/951,991

(22) Filed: Jul. 26, 2013

(65) Prior Publication Data

US 2013/0306467 A1 Nov. 21, 2013

Related U.S. Application Data

(63) Continuation of application No. 12/736,311, filed as application No. PCT/US2010/000021 on Jan. 6, 2010, now Pat. No. 8,551,267.

(60) Provisional application No. 61/205,675, filed on Jan. 22, 2009.

(51) Int. Cl.
*C23C 14/34* (2006.01)
*B21C 23/00* (2006.01)
(Continued)

(52) U.S. Cl.
CPC ............ *C23C 14/3407* (2013.01); *B21C 23/001* (2013.01); *B21J 1/04* (2013.01); *B21J 1/06* (2013.01); *C22C 21/00* (2013.01); *C22F 1/04* (2013.01); *C23C 14/3414* (2013.01)

(58) Field of Classification Search
CPC ............. C23C 14/3407; C23C 14/3414; H01J 37/3426; H01J 37/3429; C22C 21/00; C22F 1/04; B21C 23/001; B21J 1/04; B21J 1/06

USPC ......................... 204/298.12, 298.13
See application file for complete search history.

(56) References Cited

U.S. PATENT DOCUMENTS 5,160,388 A 11/1992 Legresy et al.
5,456,815 A 10/1995 Fukuyo et al.
(Continued)

FOREIGN PATENT DOCUMENTS

CN 1688740 A 10/2005
JP H 1135826 A 12/1999
(Continued)

OTHER PUBLICATIONS

English Translation of the First Office Action, The Patent Office of the People's Republic of China, issued Nov. 2, 2012 in CN 20108001648.0.
(Continued)

*Primary Examiner* — Rodney McDonald
(74) *Attorney, Agent, or Firm* — Wegman, Hessler & Vanderburg (57) ABSTRACT

Aluminum or aluminum alloy sputter targets and methods of making same are provided. The pure aluminum or aluminum alloy is mechanically worked to produce a circular blank, and then the blank is given a recrystallization anneal to achieve desirable grain size and crystallographic texture. A 10-50% additional strain is provided to the blank step after the annealing to increase the mechanical strength. Further, in a flange area of the target, the strain is greater than in the other target areas with the strain in the flange area being imparted at a rate of about 20-60% strain. The blank is then finished to form a sputtering target with desirable crystallographic texture and adequate mechanical strength.

3 Claims, 9 Drawing Sheets

(51) Int. Cl.
  *B21J 1/04*    (2006.01)
  *B21J 1/06*    (2006.01)
  *C22C 21/00*   (2006.01)
  *C22F 1/04*    (2006.01)

(56) References Cited

U.S. PATENT DOCUMENTS

| | | |
|---|---|---|
| 5,590,385 A | 12/1996 | Paik |
| 5,590,389 A | 12/1996 | Dunlop et al. |
| 5,718,778 A | 2/1998 | Murata et al. |
| 5,766,380 A | 6/1998 | Lo et al. |
| 5,780,755 A | 7/1998 | Dunlop et al. |
| 5,809,393 A | 9/1998 | Dunlop et al. |
| 5,993,575 A | 11/1999 | Lo et al. |
| 6,238,494 B1 | 5/2001 | Segal |
| 6,302,977 B1 | 10/2001 | Liu |
| 6,569,270 B2 | 5/2003 | Segal |
| 6,605,199 B2 | 8/2003 | Perry et al. |
| 6,723,187 B2 | 4/2004 | Segal et al. |
| 6,835,251 B2 | 12/2004 | Perry et al. |
| 6,908,517 B2 | 6/2005 | Segal et al. |
| 6,942,763 B2 | 9/2005 | Perry et al. |
| 7,017,382 B2 | 3/2006 | Segal et al. |
| 7,320,736 B2 | 1/2008 | Perry et al. |
| 2001/0047838 A1 | 12/2001 | Segal et al. |
| 2002/0174916 A1 | 11/2002 | Segal et al. |
| 2002/0174917 A1 | 11/2002 | Segal et al. |
| 2003/0052000 A1 | 3/2003 | Segal et al. |
| 2003/0089430 A1 | 5/2003 | Perry et al. |
| 2003/0098102 A1 | 5/2003 | Perry et al. |
| 2003/0098103 A1 | 5/2003 | Perry et al. |
| 2003/0205463 A1 | 11/2003 | Perry et al. |
| 2004/0245099 A1 | 12/2004 | Hukushima |
| 2005/0230011 A1 | 10/2005 | Perry et al. |
| 2009/0084474 A1 | 4/2009 | Cheong et al. |

FOREIGN PATENT DOCUMENTS

| | | |
|---|---|---|
| JP | 2005-517088 A | 6/2005 |
| JP | 2005-5533930 A | 11/2005 |
| WO | WO 00/31310 A1 | 6/2000 |
| WO | WO 03/066929 A2 | 8/2003 |
| WO | WO 2004/009866 A2 | 1/2004 |

OTHER PUBLICATIONS

English Translation of Notice of Reasons for Rejection, Japanese Patent Office, issued Nov. 25, 2013 in JP 2011-547952.
English Translation of Examination Report and Search Report issued Aug. 14, 2014 in TW 099101027.
International Search Report and Written Opinion mailed Mar. 29, 2010 for PCT/US2010/000021 filed Jan. 6, 2010.
International Preliminary Report on Patentability mailed Jul. 26, 2011 for PCT/US2010/000021 filed Jan. 6, 2010.

FIG.-13

MONOLITHIC ALUMINUM ALLOY TARGET AND METHOD OF MANUFACTURING

CROSS REFERENCE TO RELATED APPLICATIONS

This application is a continuation of U.S. National Phase patent application Ser. No. 12/736,311 filed on Oct. 25, 2010, which, in turn, is the U.S. National Phase Application of International Patent Application No. PCT/US2010/000021 filed Jan. 6, 2010, which, in turn, claims the priority benefit of U.S. Provisional Patent Application Ser. No. 61/205,675 filed Jan. 22, 2009.

FIELD OF INVENTION

The present invention is related to Al alloy sputtering targets and methods of manufacturing same. In particular, the invention pertains to monolithic Al alloy sputtering targets which have a desirable combination of mechanical strength and texture and a method of manufacturing these targets.

BACKGROUND OF THE INVENTION

High purity aluminum alloy sputtering targets have been widely used in semiconductor manufacturing. To achieve desirable grain size and texture, aluminum alloy target blanks are typically fabricated by mechanical working and final recrystallization anneal. Since the recrystallization anneal decreases the mechanical strength of the aluminum alloys significantly, such fabricated aluminum alloy blanks are usually bonded to a much stronger commercial aluminum alloy backing plate. However, monolithic aluminum alloy targets sometimes are more desirable due to manufacturing simplicity, lack of debonding issues, and improved recyclibility. To reduce the target deflection during sputtering and improve mechanical reliability, monolithic aluminum alloy targets need to have adequate mechanical strength in addition to desirable metallographic attributes. Various fabrication techniques, such as equal channel angular extrusion (U.S. Pat. No. 7,017,382) and cryogenic rolling (U.S. Pat. No. 6,942,763) have been utilized to fabricate aluminum alloy targets with improved mechanical strength. The term "monolithic" refers to a single piece target unit devoid of any separate or attached backing plate structure.

The prior art approaches have certain limitations. Equal channel angular extrusion processes require complex and expensive dies, usually produce rectangular shaped plates, and thus are not cost-effective to make circular sputtering targets. Cryogenic rolling requires a cumbersome liquid nitrogen setup that may create health or safety issues. In addition, both processes are energy and labor intensive.

SUMMARY OF THE INVENTION

In one exemplary aspect of the invention, a method of making a monolithic aluminum or aluminum alloy target is provided which includes the step of mechanically working an aluminum workpiece to produce a circular blank of the desired dimensions. The blank is then annealed to recrystallize the blank and achieve desirable grain size and crystallographic texture. After annealing, a 10-50% strain is applied to the annealed blank via mechanical cold working. In another exemplary embodiment, a strain of 20-60% is provided in a flange area of the target. Thus, in this embodiment, the flange area is provided with a greater strain than that imparted to the sputter area portion of the target. The blank is then finished such as by machining or the like so as to obtain a sputtering target having the requisite size and shape with desirable crystallographic texture and adequate mechanical strength.

In another exemplary embodiment, the mechanical working prior to the annealing step is achieved by a cold rolling. In another embodiment, the strain imparted to the target blank after the annealing step results from a rolling step which is performed at a temperature lower than the recrystallization temperature. Further, with regard to creation of the strain in the flange area, this, in accordance with one exemplary embodiment, may be provided by pressing the blank at a temperature lower than the recrystallization temperature.

In another exemplary embodiment, the step of imparting the 10-50% additional strain to the blank after annealing and the step of further creating 20-60% strain in the flange area are both provided by pressing the blank at a temperature lower than the recrystallization temperature. In one embodiment, the blank is pressed in an asymmetrical die. In another embodiment, the method steps of creating a 10-50% strain to the blank after the annealing and further creating a 20-60% strain in the flange area are performed via a rolling step performed with a closed die on one side at a temperature lower than the recrystallization temperature.

Pure aluminum may be utilized or the aluminum may be alloyed with one or more of the following alloying elements: copper, silicon, titanium, germanium, tungsten, silver, iron, vanadium, and nickel. The total amount of alloying elements present is about 10% or less.

In another aspect of the invention, a planar, monolithic aluminum or aluminum alloy sputter target is provided wherein the target has a sputter area having a first yield strength and a flange area having a second yield strength that is greater than the first yield strength. In another exemplary embodiment, the yield strength in the sputtering area of the target is at least 15 ksi, and the yield strength in the flange area is at least 20 ksi. In one embodiment, the sputter target sputtering area has at least about a 30% average (200) orientation, and in some embodiments, the targets have average grain sizes in the sputtering area of less than 100 µm with at least 20% by volume of the sputtering area having grain sizes of less than 5 µm.

The invention will be further described in conjunction with the appended drawings and attached detailed description.

DETAILED DESCRIPTION

In accordance with one exemplary embodiment of the invention, an Al or Al alloy billet is pressed at room temperature to a desired height. The resultant billet can then be rolled at room temperature for example to provide a target blank of requisite diameter and thickness. A recrystallization annealing of the blank may then be performed followed by quenching to room temperature. The thus recrystallized blank may be mechanically cold worked such as by cross rolling. In accordance with another exemplary embodiment, the cold worked blank may then be further cold worked such as by pressing it in an asymmetrically shaped die to form a near-net-shape target. The asymmetrically shaped die and pressing step cooperate to provide a strain on a first area of the near-net-shape target that corresponds to the target sputtering area. Additionally, due to the shaping of the die, a higher stress is placed on a second area of the near-net-shape target that will function as a flange portion of the target that is adapted for attachment such as by bolts and other mechanical fasteners to the sputtering chamber or apparatus. The stress in the second area or flange area is greater than the stress imparted in the first area of the near-net-shape target. Typically, the strain (i.e., % cold working) in the first area is about 10-50% (based upon the original thickness of the annealed blank) while the strain imparted to the second area (i.e., flange area of the target) is greater than the strain in the first area and is within the range of about 20-60%.

The thus treated near-net-shape target blank can be machined to result in a properly dimensioned sputter target.

The invention will now be described in conjunction with the following examples of specific embodiments. These examples are illustrative only and should not be construed as limiting the invention.

Example 1

Figure 1:
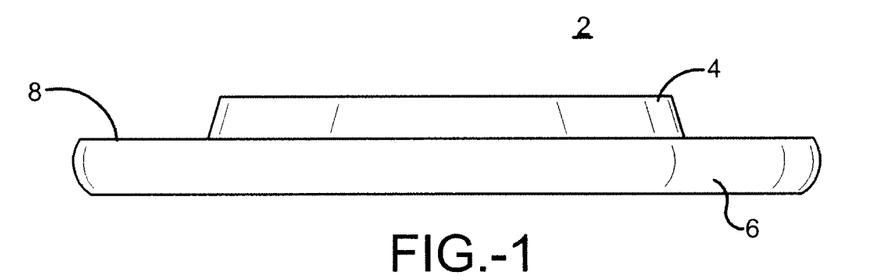
FIG. 1 is a schematic side view of a sputter target made in accordance with the invention.
Figure 2:
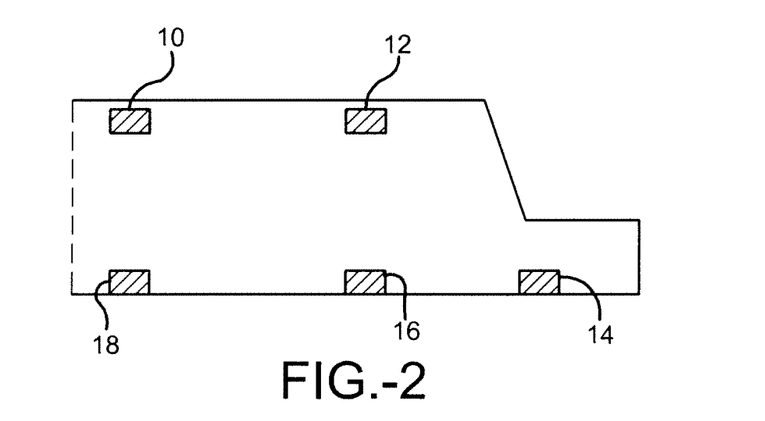
FIG. 2 is a schematic cross sectional view of one half of a sputter target made in accordance with Example 1 of the invention showing specific locations throughout the target where yield strength measurements were made.
Figure 3:
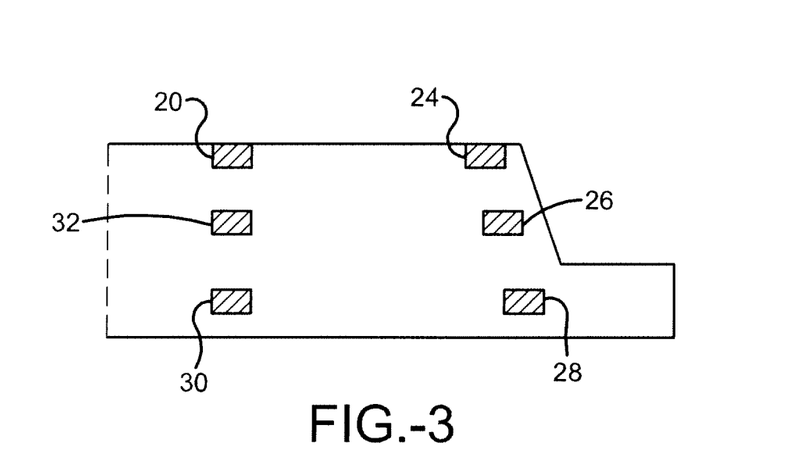
FIG. 3 is a schematic cross sectional view of one half of a sputter target made in accordance with Example 1 of the invention showing specific locations throughout the target wherein grain size measurements were made.
Figure 4:
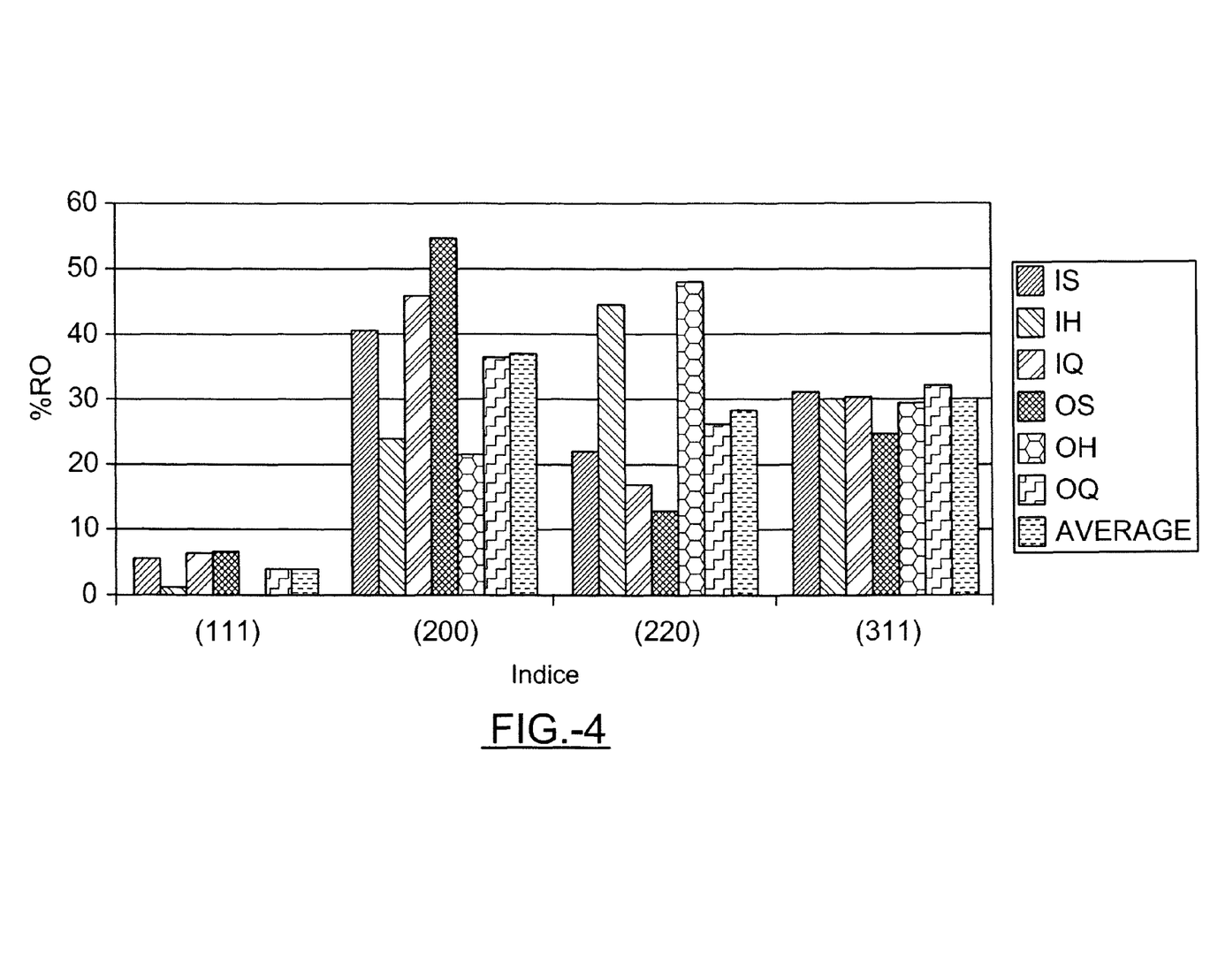
FIG. 4 is a graph showing the texture of the target of Example 1 as measured at various locations throughout the target.

A 5.25" diameter and 13.45" high cylindrical Al0.2% Si0.5% Cu billet was pressed at room temperature to a height of 4.5". The resultant billet was rolled at room temperature to form a ~14.2" diameter by 1.8" thick circular blank. The blank was annealed at 600° F. for 2 hours, water quenched to room temperature, and cross rolled at room temperature into a ~16.5" diameter by ~1.15" thick blank. The blank was then pressed with an asymmetric steel die into a near-net-shape target blank as shown in FIG. 1. Subsequently, the blank was machined into a sputtering target. As shown, the sputter target 2 comprises a sputtering portion 4 and a rear side section 6 adapted for placement adjacent a cooling liquid for heat exchange relation in accordance with standard operation. A flange section 8 is provided in the form of an annulus around the periphery of the section 6 and serves as a mounting attachment for the target 2 to a mating portion of a sputtering chamber. The mechanical strength, microstructure and crystallographic texture of the target were examined, and the results are illustrated in FIGS. 2-4. The yield strength of the target (>17 ksi) is significantly higher than that of the conventional, fully annealed target material (typically <10 ksi). An Al0.2% Si0.5% Cu target as manufactured per this Example was sputtered at a customer site for 1,000 kWh, and the sputtering performance was satisfactory. The sputtered target had the same matt appearance as a typical recrystallized Al0.2% Si0.5% Cu target bonded to a high strength Al alloy backing plate. Furthermore, due to much higher yield strength of the target, the sputtered target deflected (bowed) only 0.018" on the backside.

FIG. 2 is a diagrammatical sketch of the cross section of one half of the target in FIG. 1 showing the yield strength at the locations of the monolithic target depicted by reference numbers 10-18. The following table lists the locations and yield strength in terms of ksi.

Example 1

| Yield Strength | |
| --- | --- |
| Location | Yield Strength |
| 10 | 17.5 ksi |
| 12 | 17.7 ksi |
| 14 (flange area) | 20.3 ksi |
| 16 | 18.0 ksi |
| 18 | 17.5 ksi |

FIG. 3 is a diagrammatical sketch similar to FIG. 2 showing the cross section of one half of the target showing average grain size at locations depicted by reference numbers 20-32. The following table lists the location and average grain size.

Example 1

| Average Grain Size | |
| --- | --- |
| 20 | 62 μm |
| 24 | 45 μm |
| 26 | 39 μm |
| 28 | 42 μm |
| 30 | 49 μm |
| 32 | 38 μm |

The texture of the Example 1 target is shown in FIG. 4. Here, it can be seen that the target has the predominate (200) texture averaging about 35%. In this figure and also in FIGS. 7 and 11, the reference key is as follows: IS=inner surface; IH=inner half depth; IQ=inner quarter depth; OS=outer surface; OH=outer half depth; OQ=outer quarter depth.

Example 2

Figure 6:
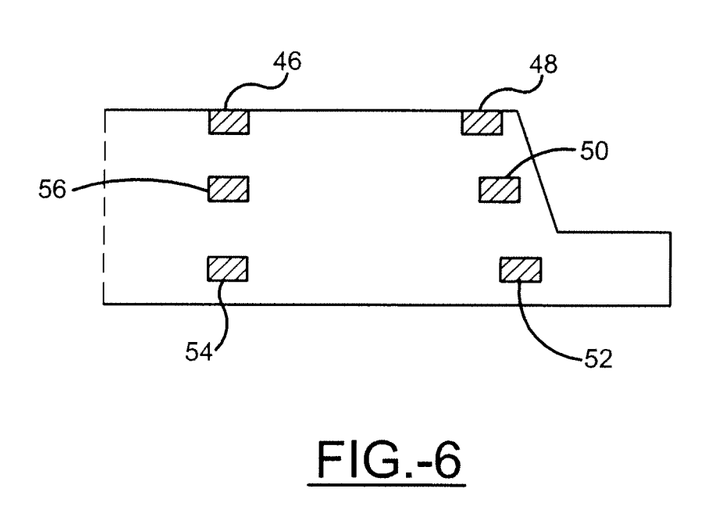
FIG. 6 is a schematic cross sectional view of one half of a sputter target made in accordance with Example 2 of the invention, showing specific locations throughout the target wherein grain size measurements were made.
Figure 7:
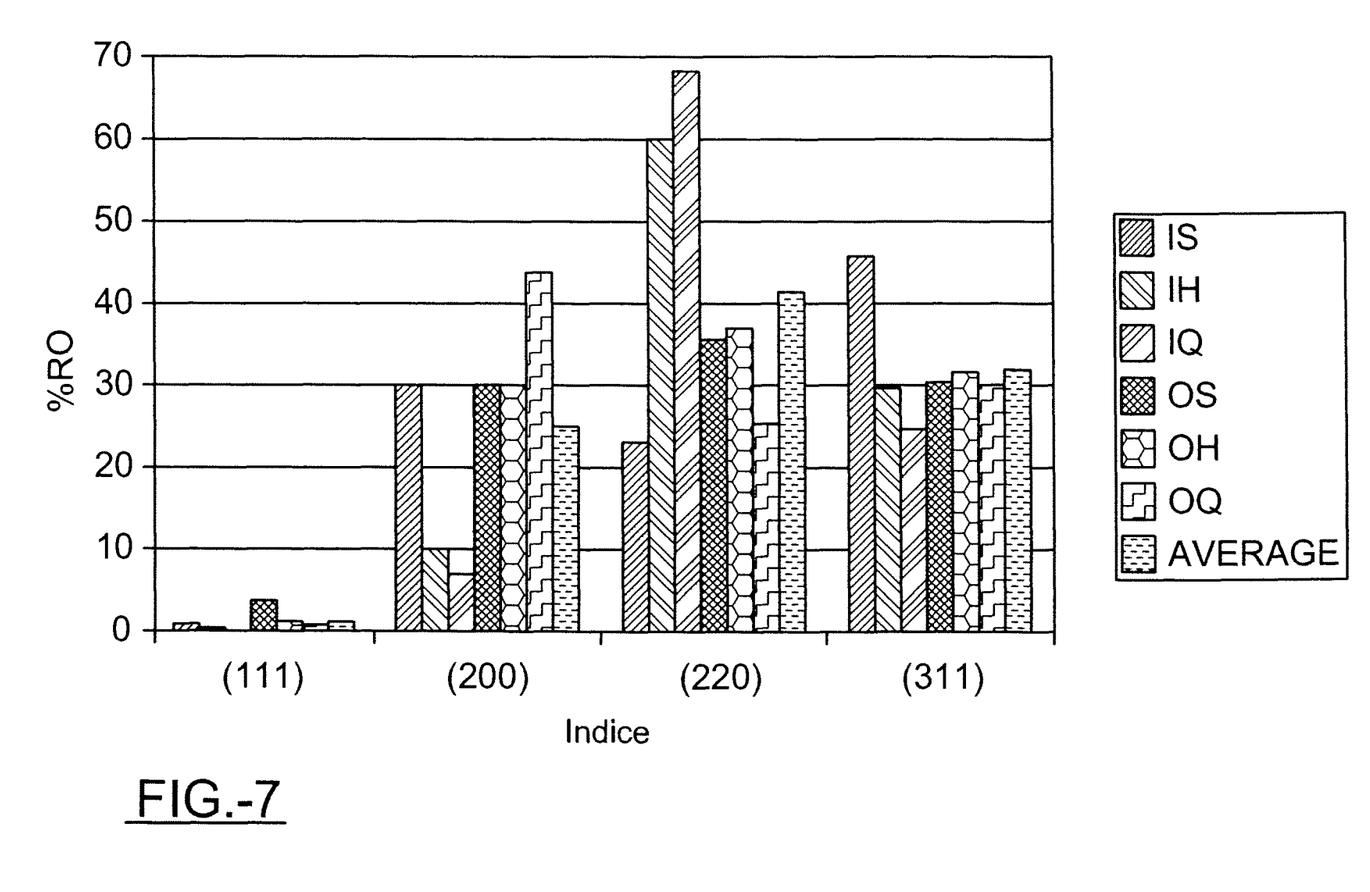
FIG. 7 is a graph showing the texture of the target of Example 2 as measured at various locations throughout the target.

A 5.25" diameter and 12.2" high cylindrical Al0.5% Cu billet was upset forged at room temperature, annealed at 600° F. for four hours and water quenched to room temperature. The billet was then pressed at room temperature to a height of 4". The resultant billet was rolled at room temperature to form a ~14.5" diameter by 1.65" thick circular blank. The blank was annealed at 550° F. for 2 hours, water quenched to room temperature, and "asymmetrically" pressed with steel dies into a near-net-shape target blank similar to that shown in FIG. 1. Subsequently, the blank was machined into a sputtering target. The mechanical strength, microstructure, and crystallographic texture of the target were examined, and the results are illustrated in FIGS. 5-7.

Figure 5:
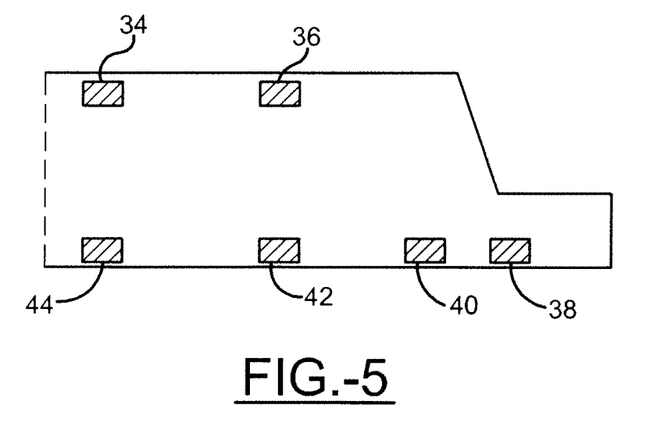
FIG. 5 is a schematic cross sectional view of one half of a sputter target made in accordance with Example 2 of the invention, showing specific locations throughout the target where yield strength measurements were made.

FIG. 5 is a diagrammatic sketch similar to that of FIG. 2, showing yield strength at various locations of the Example 2 target as follows.

Example 2

| Yield Strength | |
| --- | --- |
| 34 | 16 ksi |
| 36 | 15.3 ksi |
| 38 (flange area) | 21.3 ksi |
| 40 | 19.1 ksi |
| 42 | 15.7 ksi |
| 44 | 15.5 ksi |

FIG. 6 is a diagrammatic sketch similar to that of FIG. 3, showing the average grain size at different locations throughout the target.

Example 2

| Average Grain Size | |
| --- | --- |
| 46 | 57 μm |
| 48 | 24 μm |
| 50 | 28 μm |
| 52 | 32 μm |
| 54 | 35 μm |

Figure 8:
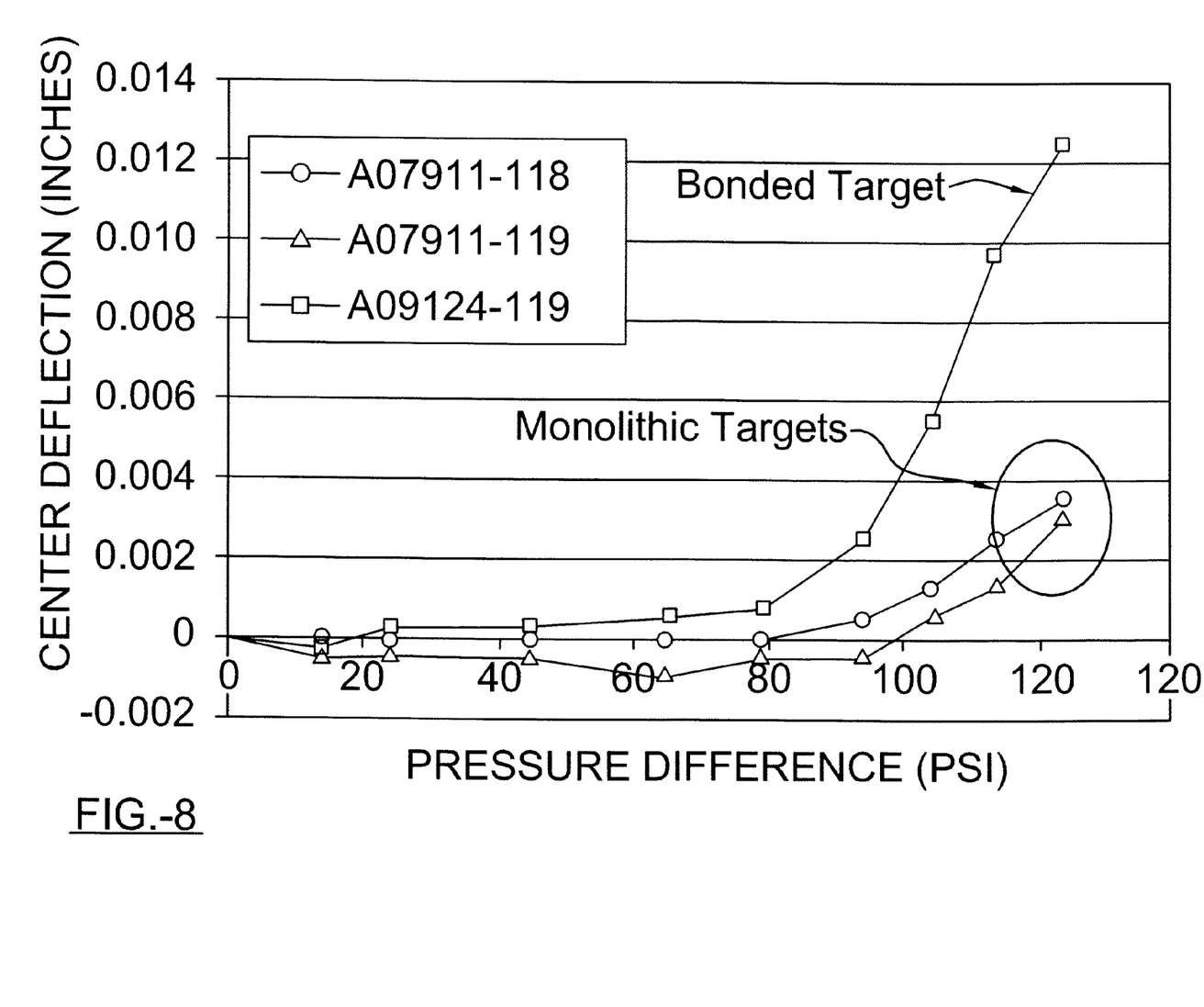
FIG. 8 is a graph showing center location deflections of two monolithic targets made in accordance with Example 2 compared to a conventional prior art bonded target.

FIG. 7 is a graph showing the texture of the target at various locations. In this case, the (220) texture is predominate in an average amount of greater than 40%. The (200) texture is present in an amount of about 30% (e.g., about 26%). Two monolithic Al0.5% Cu targets manufactured this way, together with a bonded Al0.5% Cu target (i.e., conventionally rolled and annealed—high purity Al0.5% Cu bonded to high strength Al6061-T6 alloy), were pressure stressed with vacuum on the target side and gas pressure on the backside. After each increase in pressure, the target was removed, and the deflection (bowing) at the center of the backside was measured. As depicted in FIG. 8, center reflection (bowing) of the monolithic targets is smaller than that of the bonded target.

Example 3

Figure 9:
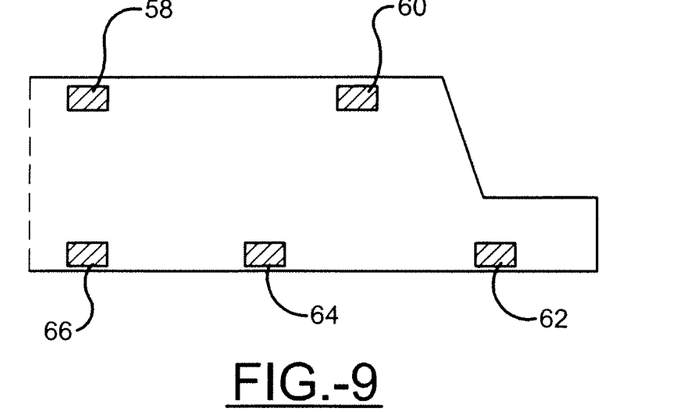
FIG. 9 is a schematic cross sectional view of one half of a sputter target made in accordance with Example 3 of the invention showing specific locations throughout the target where yield strength measurements were made.
Figure 10:
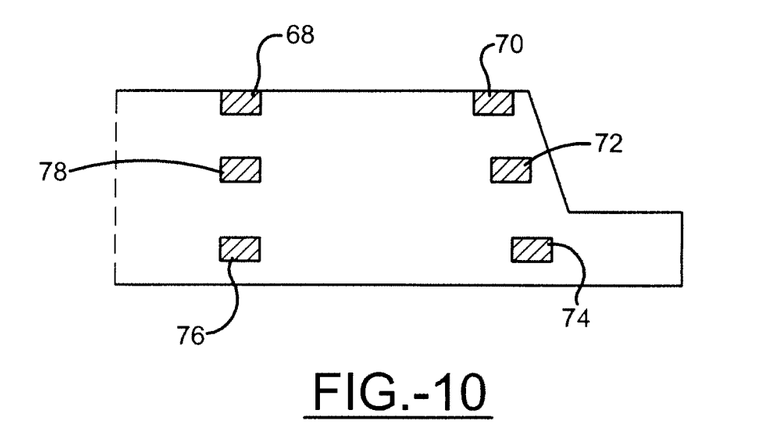
FIG. 10 is a schematic cross sectional view of one half of a sputter target made in accordance with Example 3 of the invention, showing specific locations throughout the target wherein grain size measurements were made.
Figure 11:
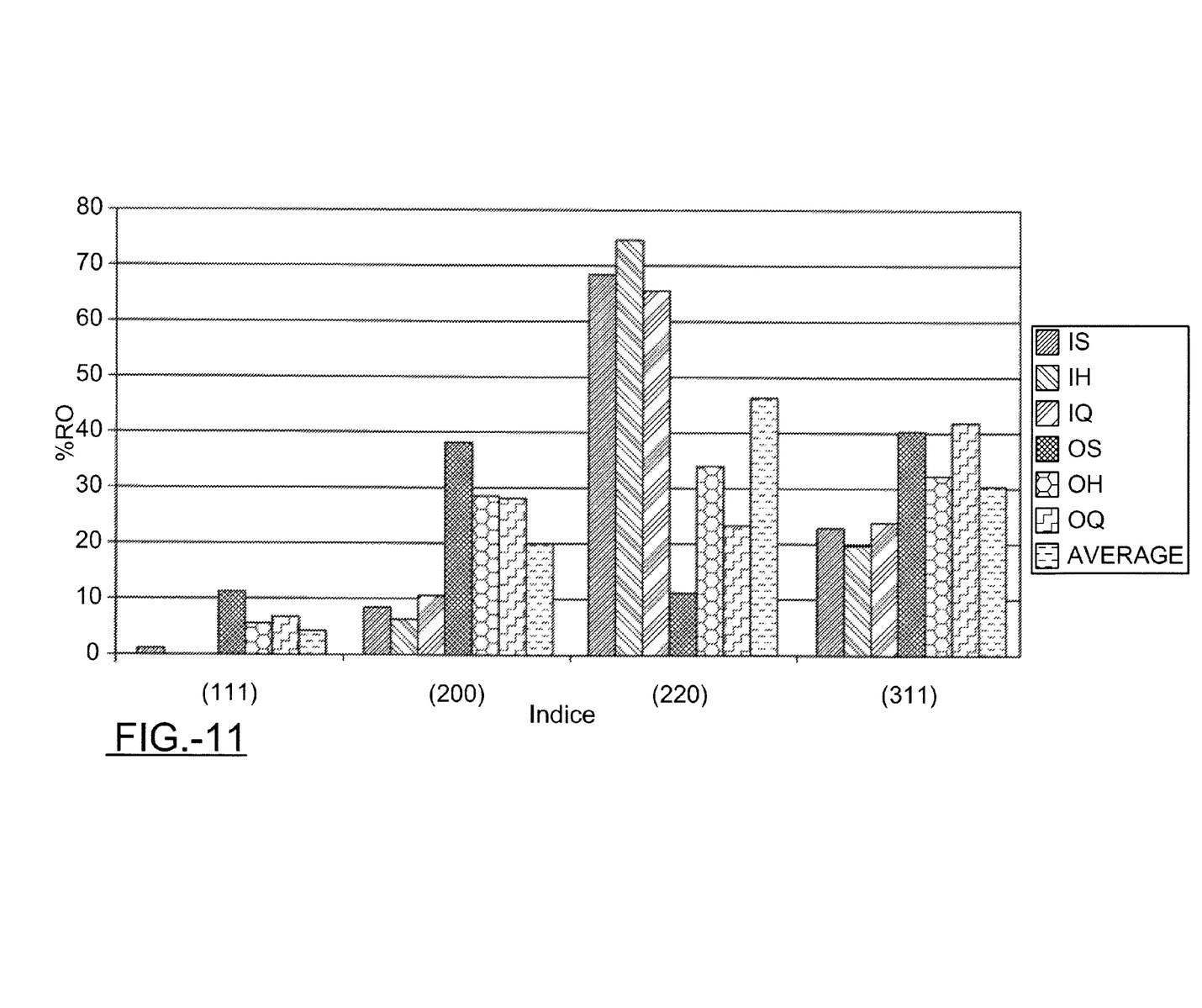
FIG. 11 is a graph showing the texture of the target of Example 3 as measured at various locations throughout the target.

A 5.25" diameter and 12.2" high cylindrical Al0.2% Si0.5% Cu billet was pressed at room temperature to a height of 4". The resultant billet was rolled at room temperature to form a ~14.5" diameter by 1.65" thick circular blank. The blank was annealed at 600° F. for 2 hours, water quenched to room temperature, and pressed with steel dies into a near-net-shape target blank similar to that shown in FIG. 1. Subsequently, the blank was machined into a sputtering target. The mechanical strength, microstructure and crystallographic texture of the target were examined The results are illustrated in FIGS. 9-11.

Yield strengths per target location shown in FIG. 9 were as follows:

Example 3

| Yield Strength | |
| --- | --- |
| Location | ksi |
| 58 | 16 |
| 60 | 17.1 |
| 62 (flange area) | 23.5 |
| 64 | 18.9 |
| 66 | 18.2 |

Average grain sizes are shown in the following table corresponding to target locations shown in FIG. 10.

Example 3

| Average Grain Size | |
| --- | --- |
| Location | μm |
| 68 | 48 |
| 70 | 34 |
| 72 | 30 |
| 74 | 28 |
| 76 | 39 |
| 78 | 29 |

The texture analysis of the Example 3 target is shown in FIG. 11. Here, the (220) texture is predominately present in an amount of greater than 40%.

The advantages of this invention over the prior art include: 1) the process is more manufacturing friendly; 2) near-net-shape pressing can save at least 10% of material; 3) the resultant textures of the target are close to those of the conventional, recrystallized Al alloy targets with proven sputtering performance.

To achieve adequate mechanical strength, monolithic Al alloy target blanks are usually fabricated by severe plastic deformation via techniques such as equal channel angular extrusion. The severe plastic deformation may not necessarily result in desirable crystallographic texture. In this invention, a mechanically worked and fully recrystallized Al alloy blank is further mechanically worked at room temperature, and thus essentially preserves the beneficial crystallographic texture of the recrystallized blanks and enhances the mechanical strength at the same time. To the knowledge of the inventors, this concept is believed to be new.

There are two main types of OEM sputter erosion patterns in practice for planar aluminum sputtering target applications. The first erodes fastest in an annulus close to the outer edge, and the second erodes in an annulus close to the center. One can imagine that the two patterns using the same aluminum plate with characteristic texture will produce different film thickness uniformities in the deposited films.

The erosion profiles noted contemplate an 8" wafer situated about 50 mm above the target. In all cases, the outer erosion area is outside the wafer, suggesting that most of the aluminum coming from this region of the target misses the wafer and only affects the thickness of the film at the wafer edge. In the case of one of these patterns, the outer groove is even further from the edge of the wafer.

In one case, the main erosion occurs about 9" diameter, and the target to wafer spacing is critical to film uniformity. The outer (main) erosion only affects the edge thickness.

In the thermomechanical processing of Al or Al alloys, a fully annealed, compression rolled plate will have a strong (200) texture and a grain size between 20 and 400 μm, depending on the heat treatment sequence, times, and temperatures. A strong (200) texture with 400 μm average grain size will produce the same wafer properties as a strong (200) texture with 35 μm average grain size. To change the deposition rate and uniformity, a different texture is required.

If one can achieve very fine grain size (below 1 μm), a well known strengthening effect that is beneficial is found and a slight modification of the texture from a strong (200) is found. This change in texture may be due to the increased volume fraction of grain boundary that can be detected in texture measurements and will impact the emission rates and directions. The strengthening occurs because the closely spaced grain boundaries limit the movement of dislocations.

We have found that by introducing dislocation tangles to fully annealed aluminum plates rather than high angle grain boundaries in the appropriate density provides a significant increase in material strength while not overly modifying the texture of the fully annealed plate. The dislocation tangles limit further dislocation movement and thus enhance mechanical strength. The introduction of the dislocations activates the slip systems and increases the detected (220) texture in the material. For center sputtering systems, this may provide a better optimization to the plasma shape established for long throw, high power applications. Between 10% and 50% strain, the annealed material absorbs work and dislocations pile up on sub-micron spacing. Individual grains take on multiple textures with slight misorientations (sub-grains) The result is a modification of the original structure with a volume fraction of dislocations in the (220) orientation.

Figure 12:
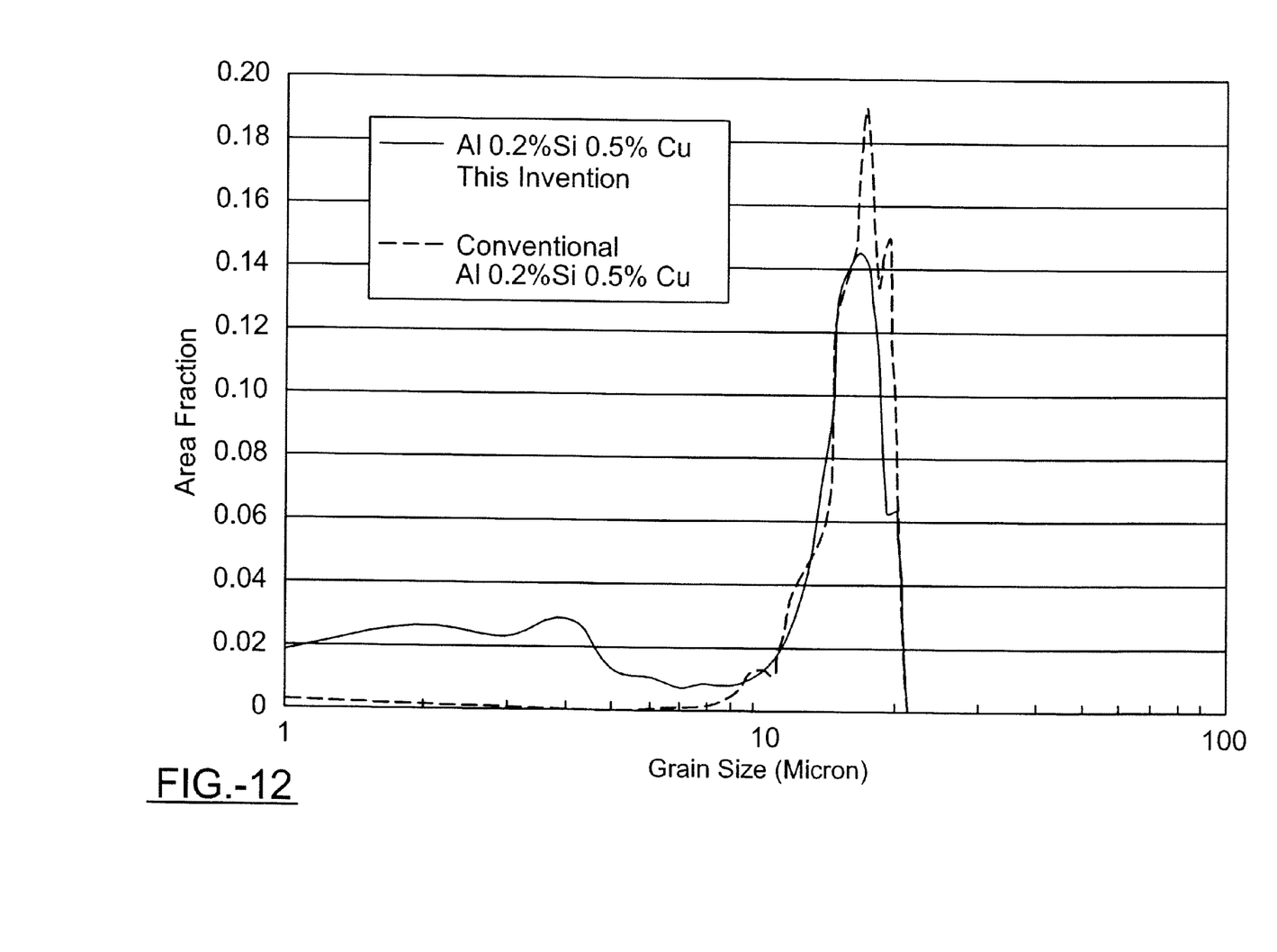
FIG. 12 is a graph illustrating sub-grain size distributions of conventional Al0.2% Si0.5% Cu targets versus that of a Al3.2% Si0.5% Cu target made in accordance with the invention.

This can be observed by etching the microstructure. The dislocation tangles become low angle grain boundaries while the original high angle boundaries remain intact. This can also be observed using EBSD (electron backscatter diffraction) to show the multiple texture components within existing grains. The EBSD images can also be used to measure the distribution of grain sizes. FIG. 12 is a graph showing the sub-micron grain distribution in conventional, prior art Al0.2 wt % Si0.5% Cu targets compared to Al0.2 wt % Cu0.5 wt % Si targets made in accordance with Example 1 of the invention. The conventional target was prepared by room temperature pressing, room temperature cross rolling, and a recrystallization anneal at 600° F. for two hours, followed by machining.

Figure 13:
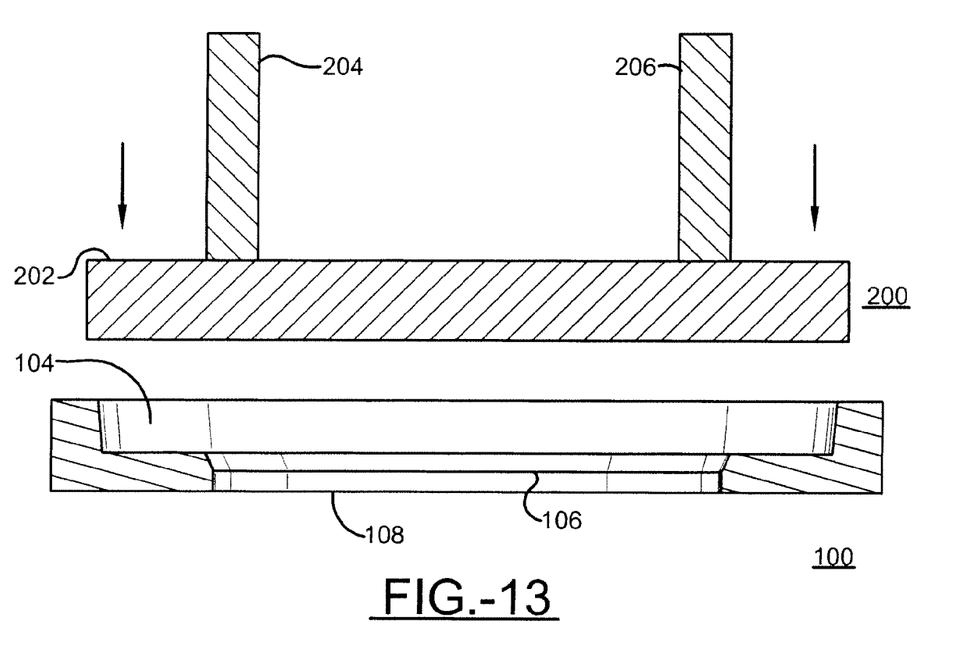
FIG. 13 is a schematic cross sectional view of an asymmetric die and press platen that may be used to provide near-net-shape targets in accordance with the invention.

FIG. 13 is a schematic of a pressing operation employing a symmetrical die 100 that may, in accordance with one embodiment, be used to produce the near-net-shape monolithic Al target. The die comprises a reduced area flange cavity 104 that upon pressing of the pure Al or Al alloy therein will form the flange portion of the target (see FIG. 1). Also, die 100 includes a sputter area portion of the die 106 with the surface 108 of the die corresponding to the portion of the die that will ultimately form the sputter surface of the target.

The press 200 includes press platen 202 which is adapted for reciprocal movement toward and away from die 100 by action of the pistons 204, 206. It can be appreciated that the metal (not shown) being compressed in die 100 will be worked (reduced in thickness) to a greater extent in flange portion 104 of the die compared to the sputter area 106. As such, the yield strength of the flange portion of the target ultimately formed by the pressing action will be greater than that of the target sputtering area.

The preceding description and accompanying drawings are intended to be illustrative of the invention and not limiting. Various other modifications and applications will be apparent to one skilled in the art without departing from the true spirit and scope of the invention as defined by the following claims.

What is claimed is:

1. A planar, monolithic Al or Al alloy sputter target, said sputter target having a sputter area having a first yield strength and a flange area having a second yield strength greater than said first yield strength, said first yield strength being at least 15 ksi and said second yield strength being at least 20 ksi, said sputtering area having at least 30% average (200) orientation, said sputter target having an average grain size throughout said target of about 24-62 μm.

2. A sputter target as recited in claim 1 wherein said target is composed of pure Al or Al alloyed with one or more alloying elements selected from the group consisting of Cu, Si, Ti, Ge, W, Ag, Fe, V, and Ni, said alloying elements present in a total amount not exceeding 10% by weight.

3. A planar, monolithic Al or Al alloy sputter target formed from a target blank, said sputter target having a first yield strength and a flange area having a second yield strength greater than said second yield strength, said first yield strength being at least 15 ksi and said second yield strength being at least 20 ksi, said sputtering area having at least 30% average (200) orientation, said sputter target having recrystallized grains when compared to grains in said target blank, said recrystallized grains having an average grain size of about 24-62 μm throughout said target.

* * * * *